United States Patent [19]

Wilhelm

[11] Patent Number: 5,640,128

[45] Date of Patent: Jun. 17, 1997

[54] TRANSIMPEDANCE AMPLIFIER CIRCUIT

[75] Inventor: Wilhelm Wilhelm, Munich, Germany

[73] Assignee: Siemens Aktiengesellschaft, Munich, Germany

[21] Appl. No.: 599,387

[22] Filed: Feb. 9, 1996

[30] Foreign Application Priority Data

Feb. 9, 1995 [DE] Germany ............... 195 04 290.5

[51] Int. Cl.⁶ ............................................. H03F 3/08
[52] U.S. Cl. ..................... 330/308; 330/110; 250/214 A
[58] Field of Search ........................... 330/59, 110, 259, 330/290, 308; 250/214 A; 359/169

[56] References Cited

U.S. PATENT DOCUMENTS 4,870,369  9/1989  Bartenstein et al. .................. 330/59

OTHER PUBLICATIONS

Electronic Circuits—Design and Applications by Ulrich Tietze and Christoph Schenk, Berlin and Heidelberg, 1991, p. 97.

*Primary Examiner*—James B. Mullins
*Attorney, Agent, or Firm*—Herbert L. Lerner; Laurence A. Greenberg

[57] ABSTRACT

A transimpedance amplifier circuit includes an inverting voltage amplifier having an input being supplied with an input current and an output carrying an output voltage. A coupling member is connected between the input and the output of the voltage amplifier. The coupling member has two diodes being connected antiserially to one another between the input and the output of the voltage amplifier with a common node point. A transistor has a load path being connected between the common node point and a ground potential. A differential amplifier has one input connected to the input of the voltage amplifier, another input connected to the output of the voltage amplifier, and an output. A low-pass filter is connected downstream of the differential amplifier for furnishing a trigger signal at the output to the transistor.

1 Claim, 1 Drawing Sheet

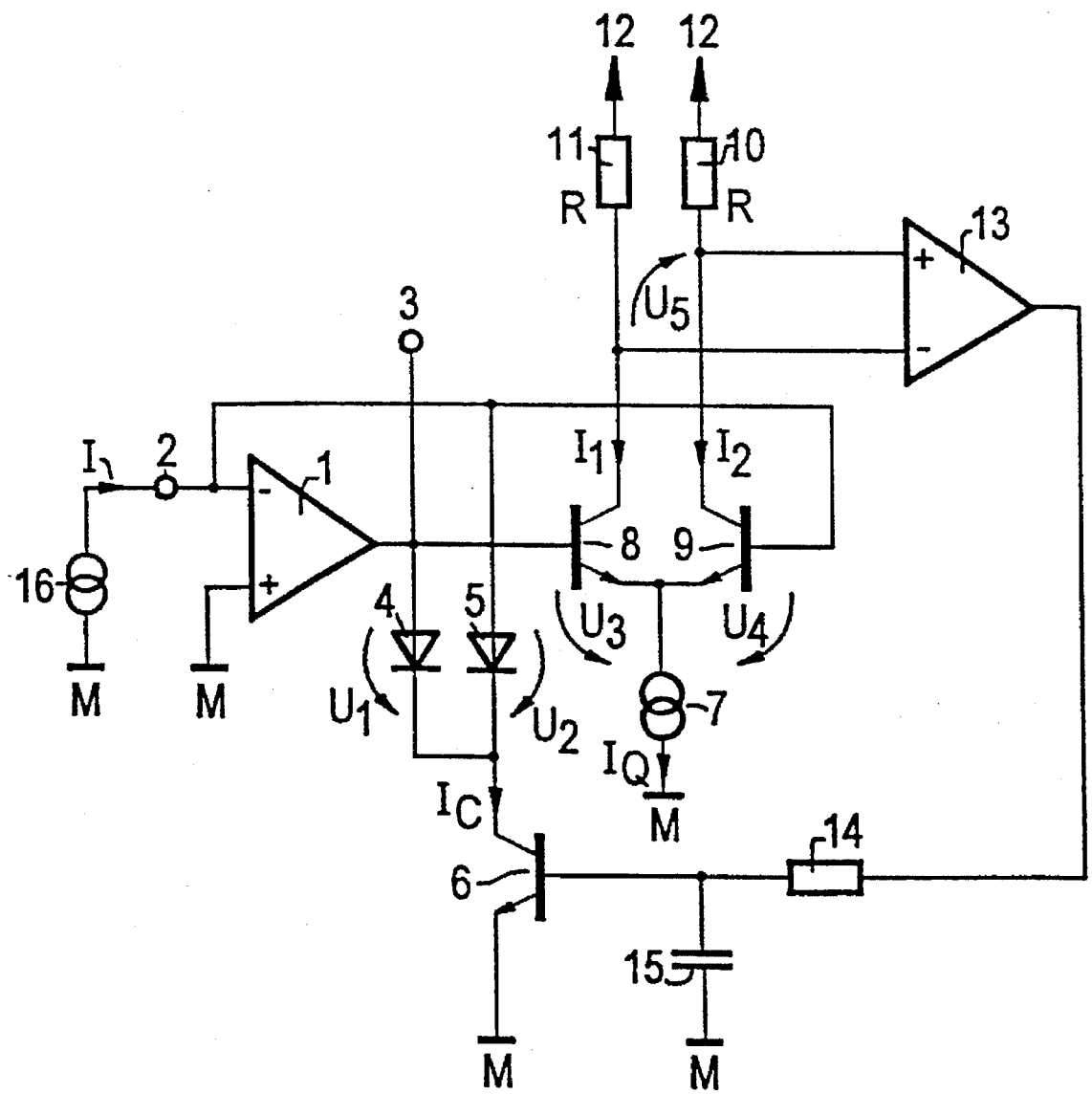

TRANSIMPEDANCE AMPLIFIER CIRCUIT

BACKGROUND OF THE INVENTION

1. Field of the Invention

The invention relates to a transimpedance amplifier circuit including an inverting voltage amplifier having an input which is supplied with an input current and an output that carries an output voltage, and a coupling member that is connected between the input and output of the voltage amplifier.

One such transimpedance amplifier circuit is known, for instance, from the book entitled: Electronic Circuits—Design and Applications, by Ulrich Tietze and Christoph Schenk, Berlin and Heidelberg, 1991, page 97, in which an ohmic resistor is provided as the coupling member. Transimpedance amplifier circuits convert an input current into a proportional voltage, and as a rule are therefore used to amplify the currents generated by photodiodes. That current may be quite small, such as 1 µA, or by comparison quite large, such as 1 mA. That presents dimensioning problems, which can be ascribed in particular to the ohmic resistor that is used in the feedback loop in the known structure.

The resistor must be small in order to avoid overdrive of the transimpedance amplifier circuit when high currents are involved. However, then the input noise of the transimpedance amplifier circuit rises, since smaller resistors produce greater thermal noise currents. Smaller resistors also reduce the sensitivity, so that small input currents are lost in the noise. However, the overall result is that the dynamic range of the transimpedance amplifier circuit is greatly restricted.

SUMMARY OF THE INVENTION

It is accordingly an object of the invention to provide a transimpedance amplifier circuit, which overcomes the hereinafore-mentioned disadvantages of the heretofore-known devices of this general type and which has a greater dynamic range.

With the foregoing and other objects in view there is provided, in accordance with the invention, a transimpedance amplifier circuit, comprising an inverting voltage amplifier having an input being supplied with an input current and an output carrying an output voltage; a coupling member being connected between the input and the output of the voltage amplifier, the coupling member having two diodes being connected antiserially to one another between the input and the output of the voltage amplifier and having a common node point; a transistor having a load path being connected between the common node point and a ground potential; a differential amplifier having one input connected to the input of the voltage amplifier, another input connected to the output of the voltage amplifier, and an output; and a low-pass filter connected downstream of the differential amplifier for furnishing a trigger signal at the output to the transistor.

The transimpedance amplifier circuit according to the invention has the advantage of adapting the feedback resistance to suit the magnitude of the input signal. This is carried out with the aid of diode paths that are biased by a direct current which is proportional to the direct component of the input current and that thus assure the requisite change in the dynamic resistance. The non-linearity of the diodes is compensated for by the following differential amplifier, so that over the entire resistance range, no errors in linearity occur.

Other features which are considered as characteristic for the invention are set forth in the appended claims.

Although the invention is illustrated and described herein as embodied in a transimpedance amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic circuit diagram of an exemplary embodiment of the invention.

DESCRIPTION OF THE PREFERRED EMBODIMENTS

Referring now to the single FIGURE of the drawing in detail, there is seen an exemplary embodiment having an inverting voltage amplifier which, by way of example, is constructed as an operational amplifier 1. A ground potential M is connected to a non-inverting input of the operational amplifier 1. An inverting input of the operational amplifier 1 forms an input 2 of the inverting voltage amplifier, and an output 3 of the operational amplifier 1 forms an output of the voltage amplifier. The input 2 is connected to one terminal of a current source 16 which has another terminal that is connected to the ground potential M. The operational amplifier is supplied with a current I.

Two diodes 4 and 5 are connected antiserially between the input 2 and the output 3 of the inverting voltage amplifier 1, specifically in such a way that anodes of the diodes 4 and 5 are respectively connected to the input 2 and the output 3, and cathodes of the diodes are interconnected. The two coupled cathodes of the diodes 4 and 5 are in turn connected to a collector of an npn transistor 6 which has an emitter terminal that is connected to the ground potential M. A base of the transistor 6 is preceded by a low-pass filter that includes a capacitor 15 which is connected between the ground potential M and the base of the transistor 6, as well as a resistor 14 which is connected to an output of an operational amplifier 13.

The operational amplifier 13 forms an output stage of a differential amplifier that has an input stage which is formed by an emitter-coupled pair of npn transistors 8, 9 supplied from a current source 7, and resistors 11, 10 connected into collector circuits of the transistors 8 and 9. Specifically, the coupled emitter transistors 8 and 9 are connected to the ground potential M through the current source 7. The collectors of the two transistors 8 and 9 are each connected to a positive supply potential 12 through a respective one of the resistors 11 and 10. The collector of the transistor 8 is moreover connected to an inverting input of the operational amplifier 13, and the collector of the transistor 9 is connected to a non-inverting input of the operational amplifier 13. Bases of the transistors 8 and 9 representing inputs of the differential amplifier are connected to the input 2 and the output 3 of the inverting amplifier 1 in such a way that the base of the transistor 8 is coupled to the output 3 and the base of the transistor 9 is coupled to the input 2.

Since the basic layout of an impedance amplifier according to the invention has been described above, its mode of operation will be discussed in more detail below.

The current I generated by the current source 16, for example a photodiode coupled with a glass fiber cable, is composed additively of a direct component $I_{DC}$ and an alternating current component $I_{AC}$. The amplitude of the alternating current component $I_{AC}$ is always less than or equal to the direct current component $I_{DC}$. The performance of the diodes 4 and 5 can be described by an exponential function, in such a way that the voltage across the diode is equal to the product of a temperature voltage $U_T$ and the logarithm of a ratio of the current flowing through it to a saturation current $I_S$. Since the diode 4 experiences a flow through it of a current which is equal to a difference between a collector current $I_C$ of the transistor 6 and the direct current component $I_{DC}$ of the current I, and since the current through the diode 5 is equal to the direct current component $I_{DC}$ of the current I, the following equations apply:

$$U_1 = U_T \cdot \ln \frac{I_C - I_{DC}}{I_S}$$

$$U_2 = U_T \cdot \ln \frac{I_{DC}}{I_S}.$$

The closed-loop control through the differential amplifier and the following low-pass filter is effected in such a way that the voltage $U_1$ becomes equal to the voltage $U_2$, and thus the collector current $I_C$ of the transistor becomes twice as great as the direct component $I_{DC}$ of the current I. Thus the direct current setting of the transimpedance amplifier circuit is clearly defined.

As to the alternating current component $I_{AC}$, the following equations apply:

$$U_1 = U_T \cdot \ln \frac{I_{DC} - I_{AC}}{I_S}$$

$$U_2 = U_T \cdot \ln \frac{I_{DC} + I_{AC}}{I_S}.$$

The base-to-emitter voltages $U_3$ and $U_4$ of the transistors 8 and 9 result from the respective associated collector currents $I_1$ and $I_2$ as follows:

$$U_3 = U_T \cdot \ln \frac{I_1}{I_S}$$

$$U_4 = U_T \cdot \ln \frac{I_2}{I_S}.$$

It is also true that the difference between the voltages $U_3$ and $U_4$ is equal to the difference between the voltages $U_1$ and $U_2$, the sum of the currents $I_1$ and $I_2$ is equal to the current Ic, and the differential input voltage $U_5$ of the operational amplifier 13 is equal to the difference between the currents $I_2$ and $I_1$, multiplied by the resistance R of the two resistors 10 and 11. It therefore follows that:

$$U_1 - U_2 = U_T \cdot \ln \frac{I_C \cdot U_{AC}}{I_C \cdot R + U_{AC}}.$$

The result, for the differential voltage, is:

$$U_5 = I_C \cdot R \cdot \frac{I_{AC}}{I_{DC}}.$$

Accordingly, the differential voltage $U_5$ is linearly dependent on the alternating current component $I_{AC}$ of the current I. Since the amount of the amplitude of the alternating current component IAC is proportional to the direct current component $I_{DC}$ of the current I, the amplitude of the differential voltage $U_5$ is not dependent on the amplitude of the alternating current component $I_{AC}$. It follows, in turn, that the transimpedance resistance $R_T$ is proportional to the inverse of the amplitude of the alternating current component $I_{AC}$.

The transimpedance resistance $R_T$, on the basis of the serial circuit of two diodes, is $R_T = 2 \cdot U_T/I_{DC}$. From the noise current (shot noise) of a diode, where $I_R^2 = 2 \cdot I_{DC} \cdot q \cdot \Delta f$, and from the transimpedance resistance $R_T$, the result is a corresponding noise voltage at the two series-connected diodes 4 and 5 of $$U_R^2 = 4 \cdot k \cdot T \cdot \Delta f \cdot U_T/I_{DC}.$$

The equivalent input noise current $I_R^2$ can thus be calculated as $$I_R^2 = \frac{2 \cdot k \cdot T \cdot \Delta f}{R_T}.$$

By comparison, the equivalent noise current when a connection is made with an ohmic resistor as the transimpedance resistor of the same resistance is $$I_R^2 = \frac{4 \cdot k \cdot T \cdot \Delta f}{R_T}.$$

The comparison shows that the square of the noise current is only half as great, for the same magnitude of transimpedance resistance $R_T$.

I claim:

1. A transimpedance amplifier circuit, comprising:

an inverting voltage amplifier having an input being supplied with an input current and an output carrying an output voltage;

a coupling member being connected between the input and the output of said voltage amplifier, said coupling member having two diodes being connected antiserially to one another between the input and the output of said voltage amplifier and having a common node point;

a transistor having a load path being connected between said common node point and a ground potential;

a differential amplifier having one input connected to the input of said voltage amplifier, another input connected to the output of said voltage amplifier, and an output; and a low-pass filter connected downstream of said differential amplifier for furnishing a trigger signal at the output to said transistor.

* * * * *